United States Patent
Wang (10) Patent No.: US 10,326,176 B2
(45) Date of Patent: Jun. 18, 2019

(54) SYSTEM AND METHOD FOR MONITORING A STATE OF HEALTH OF A BATTERY SYSTEM

(71) Applicant: ENERDEL, INC., Greenwood, IN (US)

(72) Inventor: Zhengming Wang, Greenwood, IN (US)

(73) Assignee: Enerdel, Inc., Indianapolis, IN (US)

( * ) Notice: Subject to any disclaimer, the term of this patent is extended or adjusted under 35 U.S.C. 154(b) by 521 days.

(21) Appl. No.: 14/923,938

(22) Filed: Oct. 27, 2015

(65) Prior Publication Data

US 2016/0248126 A1    Aug. 25, 2016

Related U.S. Application Data (63) Continuation of application No. PCT/US2014/035870, filed on Apr. 29, 2014.
(Continued)

(51) Int. Cl.
*G01N 27/416* (2006.01)
*H01M 10/42* (2006.01)
(Continued)

(52) U.S. Cl.
CPC ....... *H01M 10/4285* (2013.01); *B60L 3/0046* (2013.01); *B60L 3/12* (2013.01);
(Continued)

(58) Field of Classification Search
CPC ............ G01R 31/3662; G01R 31/3648; G01R 31/3658; G01R 31/3624; G01R 31/3675; G01R 31/3679; G01R 31/361; G01R 31/36; H01M 10/4285; H01M 10/486; H01M 10/42; H01M 10/48; H01M 10/484; B60L 2240/80; B60L 2240/549; B60L 2240/547; B60L 2240/545
See application file for complete search history.

(56) References Cited

U.S. PATENT DOCUMENTS

| 2009/0051364 A1* | 2/2009 | Ishida | H01M 10/48 324/430 |
| 2009/0112495 A1* | 4/2009 | Center | G01R 31/3648 702/63 |

(Continued)

FOREIGN PATENT DOCUMENTS

| JP | 2013055768 A | 3/2013 |
| JP | 2013074784 A | 4/2013 |

(Continued)

OTHER PUBLICATIONS

International Search Report, ISA/RU, International Application No. PCT/US14/35870, dated Sep. 18, 2014.
(Continued)

*Primary Examiner* — Thang X Le
(74) *Attorney, Agent, or Firm* — Faegre Baker Daniels LLP (57) ABSTRACT

Systems and methods for monitoring a state of health of a battery are disclosed. The state of health of the battery may be determined based on an internal resistance of the battery. The state of health of the battery may be determined based on a measured terminal voltage of the battery, a measured current of the battery, a temperature of the battery, and a state-of-charge of the battery.

19 Claims, 6 Drawing Sheets

Related U.S. Application Data (60) Provisional application No. 61/817,297, filed on Apr. 29, 2013.

(51) Int. Cl.

| | | |
|---|---|---|
| *G01R 31/374* | (2019.01) | |
| *G01R 31/389* | (2019.01) | |
| *G01R 31/392* | (2019.01) | |
| *H01M 10/48* | (2006.01) | |
| *B60L 3/00* | (2019.01) | |
| *B60L 3/12* | (2006.01) | |
| *B60L 11/18* | (2006.01) | |

(52) U.S. Cl.
CPC ....... *B60L 11/1857* (2013.01); *B60L 11/1861* (2013.01); *B60L 11/1864* (2013.01); *B60L 11/1872* (2013.01); *G01R 31/374* (2019.01); *G01R 31/389* (2019.01); *G01R 31/392* (2019.01); *H01M 10/48* (2013.01); *H01M 10/486* (2013.01); *B60L 2240/545* (2013.01); *B60L 2240/547* (2013.01); *B60L 2240/549* (2013.01); *B60L 2240/80* (2013.01); *H01M 2220/20* (2013.01); *Y02T 10/7005* (2013.01); *Y02T 10/7044* (2013.01); *Y02T 10/7061* (2013.01)

(56) References Cited

U.S. PATENT DOCUMENTS

| | | | | |
|---|---|---|---|---|
| 2009/0195219 | A1* | 8/2009 | Morita | B60L 3/0046 |
| | | | | 320/162 |
| 2010/0185405 | A1* | 7/2010 | Aoshima | B60L 3/0046 |
| | | | | 702/63 |
| 2010/0224157 | A1* | 9/2010 | Mizuno | G01R 31/361 |
| | | | | 123/179.4 |
| 2011/0234167 | A1* | 9/2011 | Kao | G01R 31/361 |
| | | | | 320/132 |
| 2012/0256569 | A1* | 10/2012 | Kawahara | H01M 10/486 |
| | | | | 318/139 |
| 2014/0285156 | A1* | 9/2014 | Mukaitani | G01R 31/3624 |
| | | | | 320/134 |

FOREIGN PATENT DOCUMENTS

| | | |
|---|---|---|
| RU | 95120209 A | 12/1997 |
| WO | 1993015543 A1 | 8/1993 |

OTHER PUBLICATIONS

Written Opinion, ISA/RU, International Application No. PCT/US14/35870, dated Aug. 7, 2014.

\* cited by examiner

SYSTEM AND METHOD FOR MONITORING A STATE OF HEALTH OF A BATTERY SYSTEM

RELATED APPLICATION

This application is continuation of PCT Application No. PCT/US 2014/035870 filed Apr. 29, 2014, titled SYSTEM AND METHOD FOR MONITORING A STATE OF HEALTH OF A BATTERY SYSTEM, which claims priority to U.S. Provisional Application Ser. No. 61/817,297, filed Apr. 29, 2013, titled SYSTEM AND METHOD FOR MONITORING A STATE OF HEALTH OF A BATTERY SYSTEM, the entire disclosures of which are expressly incorporated by reference herein.

FIELD

The disclosure relates in general to methods and systems for monitoring a battery system and, more particularly, to methods and systems for monitoring a state of health of a battery system.

BACKGROUND

Exemplary battery assemblies are disclosed in U.S. Pat. No. 7,531,270; US Published Application No. US2010/0273042, titled BATTERY ASSEMBLY WITH TEMPERATURE CONTROL DEVICE; US Published Application No. US 2010/0304203, titled BATTERY ASSEMBLY WITH TEMPERATURE CONTROL DEVICE; U.S. patent application Ser. No. 13/508,770, titled SCALABLE BATTERY MODULE; U.S. patent application Ser. No. 13/793,155, titled ENERGY STORAGE SYSTEM; and PCT Patent Application Serial No. PCT/US11/52169, titled ENERGY STORAGE SYSTEM, the disclosures of which are expressly incorporated by reference herein.

SUMMARY

In an exemplary embodiment of the present disclosure, a method for monitoring a battery connected to a load is provided. The method comprising determining with at least one electronic controller an internal resistance of the battery; and determining with the at least one electronic controller a state-of-health (SOH) of the battery based on the determined internal resistance of the battery. In one example, the method further comprises the steps of measuring a voltage of the battery; measuring a temperature of the battery; and measuring a current of the battery, wherein the internal resistance of the battery is based on the measured voltage, the measured temperature, and the measured voltage. In a variation thereof, the method further comprises determining with the at least one electronic controller a state-of-charge (SOC) of the battery, wherein the internal resistance of the battery is based on the determined state-of-charge (SOC).

In another exemplary embodiment of the present disclosure, a system for monitoring a battery connected to a load is provided. The system comprising at least one measurement element configured for measuring a terminal voltage, a current of the battery, a temperature of the battery, and State of Charge (SOC); and means for determining a state of health (SOH) of the battery. In one example, the means for determining a state-of-health (SOH) of the battery includes at least one electronic controller which determines the state-of-health (SOH) of the battery based on a determined internal resistance of the battery, the measured terminal voltage of the battery, and the measured current of the battery. In a variation thereof, the at least one electronic controller determines a state-of-charge (SOC) of the battery, wherein the internal resistance of the battery is based on the determined state-of-charge (SOC).

In yet another exemplary embodiment of the present disclosure, a system for monitoring a battery connected to a load is provided. The system comprising at least one measurement element configured for measuring a terminal voltage and a current of the battery; and means for determining a state of health (SOH) of the battery. In one example, the means for determining a state-of-health (SOH) of the battery includes at least one electronic controller which determines the state-of-health (SOH) of the battery based on a determined internal resistance of the battery, the measured terminal voltage of the battery, and the measured current of the battery. In a variation thereof, the at least one electronic controller determines a state-of-charge (SOC) of the battery, wherein the internal resistance of the battery is based on the determined state-of-charge (SOC).

In a further exemplary embodiment of the present disclosure, a method for monitoring a battery connected to a load is provided. The method comprising determining with at least one electronic controller an internal resistance of the battery; and determining with the at least one electronic controller a state-of-health (SOH) of the battery based on the determined internal resistance of the battery. In one example, the method further comprises the steps of measuring a voltage of the battery; measuring a temperature of the battery; and measuring a current of the battery, wherein the internal resistance of the battery is based on the measured voltage, the measured temperature, and the measured current. In a variation thereof, the method further comprises the step of determining with the at least one electronic controller a state-of-charge (SOC) of the battery, wherein the internal resistance of the battery is based on the determined state-of-charge (SOC).

In a further variation thereof, the method further comprises the steps of determining an electromotive force of the battery with the at least one electronic controller; determining a first voltage drop of the battery due to polarization of the battery with the at least one electronic controller; and determining a second voltage drop of the battery due to hysteresis of the battery with the at least one electronic controller. The internal resistance of the battery is based on the determined electromotive force of the battery, the determined first voltage drop of the battery, and the second voltage drop of the battery. In a still further variation thereof, the at least one electronic controller determines the electromotive force of the battery, the first voltage drop of the battery, and the second voltage drop of the battery based on the determined state-of-charge (SOC).

In another variation thereof, the at least one electronic controller determines the electromotive force of the battery, the first voltage drop of the battery, and the second voltage drop of the battery based on the determined state-of-charge (SOC) and the measured temperature of the battery. In a variation thereof, the at least one electronic controller determines the internal resistance of the battery by subtracting the electromotive force of the battery, the first voltage drop of the battery, and the second voltage drop of the battery from the measured voltage of the battery and dividing by the measured current.

In another example thereof, the step of determining with the at least one electronic controller the internal resistance of the battery includes the step of determining an average internal resistance of the battery. In a variation thereof, the state-of-health (SOH) of the battery is based on the determined average internal resistance of the battery. In a further variation thereof, the method further comprises the steps of determining with the at least one electronic controller an average state-of-charge (SOC) of the battery; and determining with the at least one electronic controller an average temperature of the battery, wherein the state-of-health (SOH) of the battery is further based on the determined average state-of-charge (SOC) of the battery and on the determined average temperature of the battery. In a further variation thereof, the at least one electronic controller measures a set of values of the battery at a plurality of spaced apart intervals, the set of values including a measured voltage of the battery, a measured temperature of the battery; and a measured current of the battery. In a further variation thereof, the at least one electronic controller for each set of values determines a state-of-charge (SOC) of the battery. In still a further variation thereof, the at least one electronic controller for each set of values determines an electromotive force of the battery, a first voltage drop of the battery due to polarization of the battery, and a second voltage drop of the battery due to hysteresis of the battery. In yet a further variation thereof, the average internal resistance is determined by the at least one electronic controller by the following relationship:

$$(R_I)_{AV} = \frac{\sum_{N=2}^{N_{STOP}} |\Delta V_N|}{\sum_{N=2}^{N_{STOP}} |\Delta I_N|}$$

wherein $\Delta V_N = ((V_T)_N - ((EMF)_N + (V_P)_N + (h)_N)) - ((V_T)_{N-1} - ((EMF)_{N-1} + (V_P)_{N-1} + (h)_{N-1}))$ and $\Delta I_N = (I_N - I_{N-1})$, wherein $(R_I)_{AV}$ is the determined average internal resistance, I is the measured current of the battery, $V_T$ is the measured voltage of the battery, EMF is the determined electromotive force of the battery, $V_P$ is determined first voltage drop of the battery due to polarization of the battery, h is the determined a second voltage drop of the battery due to hysteresis of the battery, and N is an interval identifier of the set of values. In still a further variation thereof, the method further comprises the steps of determining with the at least one electronic controller an average state-of-charge (SOC) of the battery; and determining with the at least one electronic controller an average temperature of the battery, wherein the state-of-health (SOH) of the battery is further based on the determined average state-of-charge (SOC) of the battery and on the determined average temperature of the battery. In another variation thereof, the at least one electronic controller clears the set of values from a memory if a condition of the battery is not satisfied. In a further variation thereof, the condition of the battery is one of the determined state-of-charge (SOC) is not within a first range; the measured temperature is not within a second range; a product of the measured current from a current interval and a preceding interval is less than zero; a difference of the measured current from a current interval and a preceding interval is greater than a first threshold; a maximum change in the determined state-of-charge (SOC) is greater than a second threshold; and a maximum change in the measured temperature is greater than a third threshold.

The above and other features of the present disclosure, which alone or in any combination may comprise patentable subject matter, will become apparent from the following description and the attached drawings.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner

DETAILED DESCRIPTION OF THE DRAWINGS

The embodiments disclosed herein are not intended to be exhaustive or to limit the invention to the precise forms disclosed in the following detailed description. Rather, the embodiments are chosen and described so that others skilled in the art may utilize their teachings. The battery systems disclosed herein may be used in multiple applications. Exemplary applications include storing and providing energy to a power grid, providing power to a vehicle to propel the vehicle, and providing an uninterrupted power supply for computing devices and other equipment in data centers.

Figure 1:
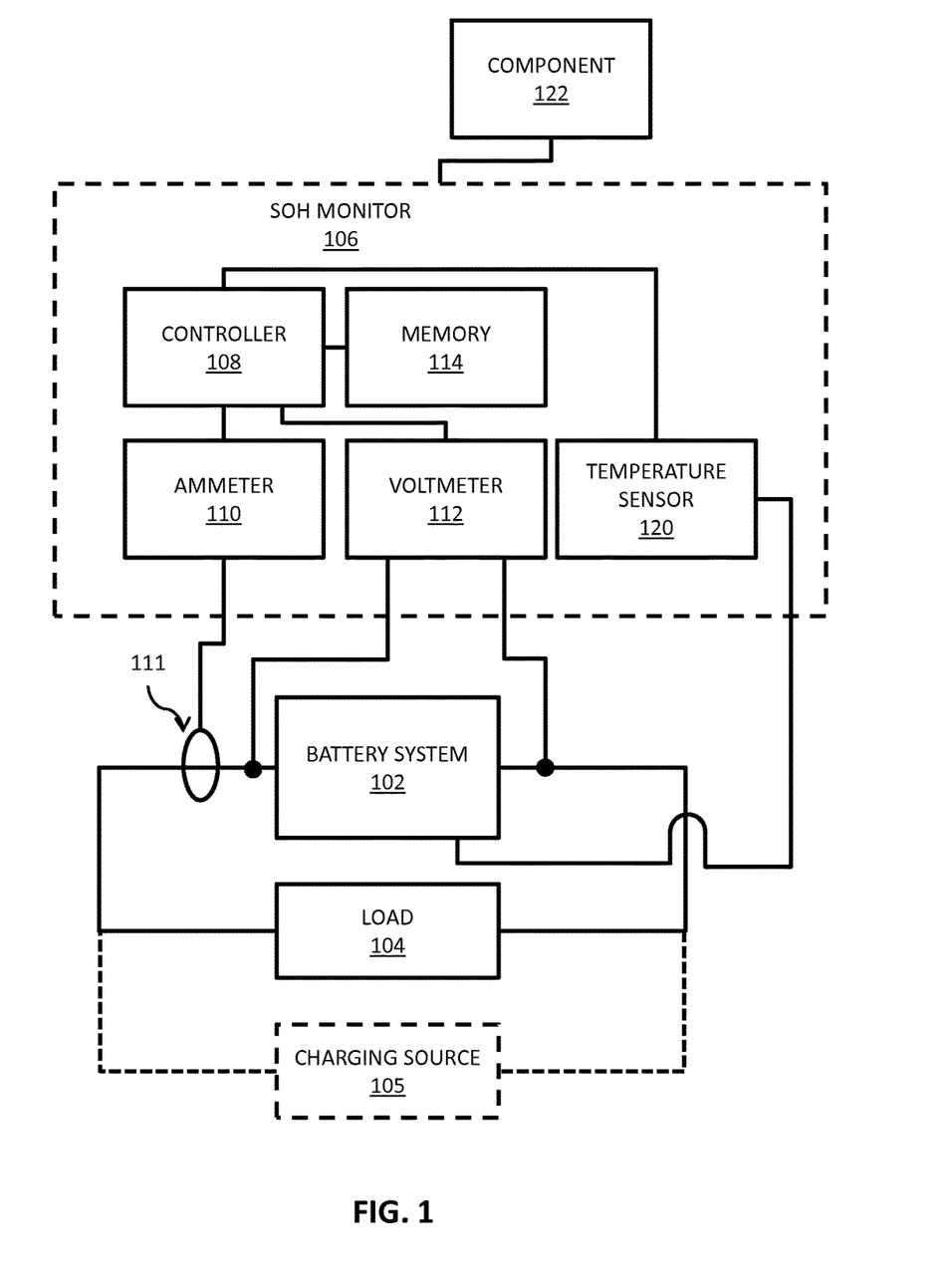
FIG. 1 illustrates a representative view of a battery-operated system including SOH monitoring of a battery system by an exemplary SOH monitor

FIG. 1 is a block diagram of a system 100 configured for state-of-health ("SOH") monitoring of a battery system 102. As used herein, the term state-of-health or SOH means a measure of the ability of the battery or battery system to repeatably provide its rated capacity over time. SOH may be provided as a percentage, as a level, and other suitable measure. Although FIG. 1 shows an exemplary architecture for a system including SOH monitoring, the various embodiments of the invention are not limited in this regard. Rather, other configurations and architectures may be used in the various embodiments of the invention. For example, in various embodiments of the invention, a system may be provided with more or less components than shown in FIG. 1. Further, one or more components shown in FIG. 1 may also be combined. Additionally, one or more of the components in FIG. 1 may be locally or remotely located with respect to a battery in system 102.

As shown in FIG. 1, system 100 includes a battery 102 and a load 104 for drawing power from the battery 102. Alternatively, system 100 can also include an electrical power source 104 for charging battery 102. As used herein, the term "battery" or "battery system" refers to any combination of one or more electrochemical cells configured to convert energy between stored chemical energy and electrical energy. In one embodiment, system 100 may also include an electrical power supply or source 105 for providing a current to load 104 and/or for recharging battery 102. For example, source 105 may comprise an alternator, a generator, or any other device with a regulator for generating direct electrical current. In one embodiment, source 105 is configured to provide a charging current to battery 102 to reduce the amount of damage to battery 102 during charging. Such configurations are well-known to those of ordinary skill in the art and will not be described herein.

System 100 further includes a SOH monitor 106 for monitoring the SOH of battery 102. As shown in FIG. 1, SOH monitor 106 may include a current measuring device 110 for determining a current (I) during charging or discharging of battery 102. Although shown in FIG. 1 as inductively determining the current with a coil 111 (Hall effect current sensor), other suitable sensor devices may be used to monitor the current. In one embodiment, current measuring device 110 provides an indication of the current to a controller 108 of SOH monitor 106. SOH monitor 106 may also include a voltage measuring device 112 for determining a terminal voltage ($V_t$) of the battery. In one embodiment, voltage measuring device 112 provides an indication of the voltage to a controller 108 of SOH monitor 106. The output of current measuring device 110 and voltage measuring device 112 may be provided to controller 108. Controller 108 is configured to compute the SOH based on these measured values and values stored in a memory element 114 of SOH monitor 106. This will be described in greater detail below with respect to FIGS. 5A and 5B. One or more signals indicative of the current SOH may then be output to another component 122. For example, the signals may be output to a display (or other user interface) or any other component for storing, transmitting, or displaying an indication of the SOH. In one embodiment, a temperature associated with battery 102 is also monitored by one or more temperature sensors 120 which provide an indication of the temperature of the battery 102. The temperature sensors 120 may monitor a temperature of the battery 102, a temperature of a region proximate to the battery 102, or a combination thereof.

Figure 2:
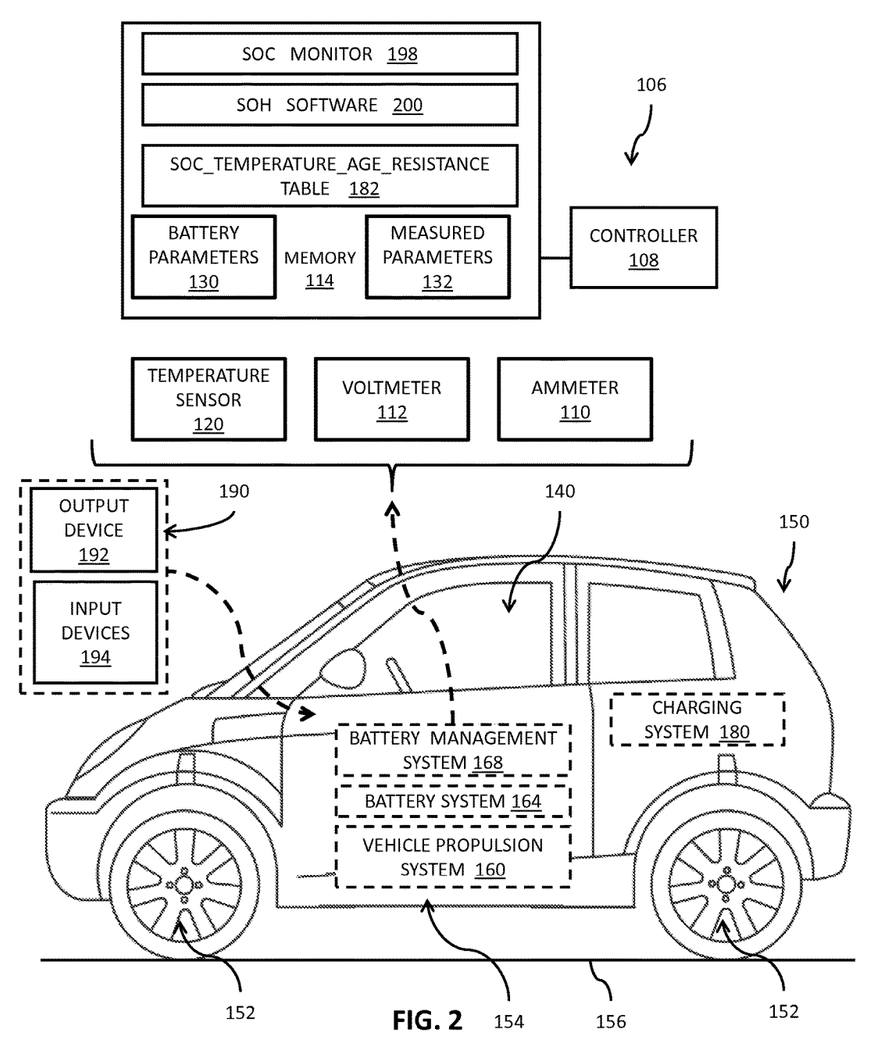
FIG. 2 illustrates an exemplary application device.

As described above, memory 114 is configured to store various values. Referring to FIG. 2, memory 114 stores one or more battery parameters 130. Battery parameters 130 may include constants, computed values, and other suitable values needed to determine the SOH of battery system 102. Exemplary constant values include the full charge capacity of the battery (Q), a polarization decay constant (K), charge/discharge efficiency ($\gamma$), and a hysteresis decay constant ($\mu$). Depending on the type of battery, separate values for discharge efficiency and charge efficiency may be specified.

In addition, memory 114 stores various measured values 132. Exemplary measured values include a charge or discharge current (I) of the battery, a terminal voltage ($V_t$) of the battery, and a temperature (T) associated with the battery. Memory 114 further includes one or more databases which provide additional battery parameters based on the current SOC value associated with the battery or based on the current SOC value associated with the battery and the temperature (T) associated with the battery. Exemplary database arrangements include an array of values, a look-up table, and other suitable arrangements for organizing data.

Referring to FIG. 2, an exemplary application device, vehicle 150 is shown. Vehicle 150 includes a plurality of ground engaging members 152, illustratively wheels and associated tires. A frame 154 of vehicle 150 is supported above the ground 156 by the ground engaging members 152. A vehicle propulsion system 160 is also supported by ground engaging members 152 and is operatively coupled to at least one of ground engaging members 152 to power the movement of vehicle 150 relative to ground 156. Vehicle propulsion system 160 may be supported by frame 154.

In one embodiment, the vehicle propulsion system 160 includes an electric motor which receives electrical energy from battery system 164 over electrical power cables of a vehicle propulsion bus. The electric motor is operatively coupled to one or more ground engaging members 152 through a power transfer system. Exemplary power transfer systems include transmissions and drive shafts. Battery system 164 includes a plurality of batteries, such as represented by battery 102 in FIG. 1. Exemplary batteries 102 include lithium ion batteries, lead acid batteries, NiCd batteries, NiMH batteries, molten salt batteries, and other suitable battery chemistries. An exemplary molten salt battery is the ZEBRA brand battery available from FZ SoNick located at Via Laveggio, 15 6855 Stabio in Switzerland. In one embodiment, the plurality of batteries 102 are provided in one or more battery packs or assemblies. Exemplary batteries and battery assemblies are provided in U.S. Pat. No. 7,531,270; US Published Application No. US2010/0273042, titled BATTERY ASSEMBLY WITH TEMPERATURE CONTROL DEVICE; US Published Application No. US 2010/0304203, titled BATTERY ASSEMBLY WITH TEMPERATURE CONTROL DEVICE; U.S. patent application Ser. No. 13/508,770, titled SCALABLE BATTERY MODULE; U.S. patent application Ser. No. 13/793,155, titled ENERGY STORAGE SYSTEM; and PCT Patent Application Serial No. PCT/US11/52169, titled ENERGY STORAGE SYSTEM, the disclosures of which are expressly incorporated by reference herein in their entirety.

In the illustrated embodiment, battery system 164 provides at least a portion of the motive power for vehicle 150. In one embodiment, vehicle propulsion system 160 converts the power provided by batteries 102 to AC to drive an AC electric motor. In one example, battery system 164 provides at least about 200 V to vehicle propulsion system 160. In one example, battery system 164 provides up to about 400 V to vehicle propulsion system 160. In one example, battery system 164 provides in the range of about 240 V to about 400 V to vehicle propulsion system 160.

Vehicle 150 includes a battery management system 168 which monitors the battery system 164 and controls the operation of the battery system 164. In one embodiment, battery management system 168 includes a state-of-charge ("SOC") monitor 198 and a state-of-health ("SOH") monitor 200. In one embodiment, SOC monitor 198 and SOH monitor 200 are separate systems. In one embodiment, SOC monitor 198 and SOH monitor 200 are in the same system. In one embodiment, one or both of SOC monitor 198 and SOH monitor 200 are separate from and communicate with the battery management system 168. In the illustrated embodiment, SOC monitor 198 and SOH monitor 200 are both software modules that are executed by controller 108. An exemplary SOC monitor 198 is disclosed in U.S. patent application Ser. No. 13/567,785, titled MONITORING BATTERY STATE OF CHARGE, published as US2012/0310568, the disclosure of which is expressly incorporated by reference herein.

Vehicle 150 further includes a charging system 180 which provides a charge current to battery system 164. Exemplary charging systems include a generator, a plug-in connection, and other suitable devices for charging battery system 164.

As mentioned in connection with FIG. 1, SOH monitor 106 may communicate an indication of the SOH of the battery to a remote component 122. In the illustrated example of FIG. 3, the remote component is a user interface 190 of vehicle 150. User interface 190 includes one or more input devices 194 and one or more output devices 192. Exemplary output devices include gauges, displays, lights, and other suitable devices for communicating an indication of the SOH to an operator of vehicle 150. Exemplary input devices 194 include buttons, dials, switches, a touch screen, and other suitable devices for receiving an input from an operator of vehicle 150. In one embodiment, the indication of the SOH is provided by one or more output devices 192 automatically. In one embodiment, the indication of the SOH is provided by one or more output devices 192 in response to an input received by at least one of the input devices 194.

Figure 3:
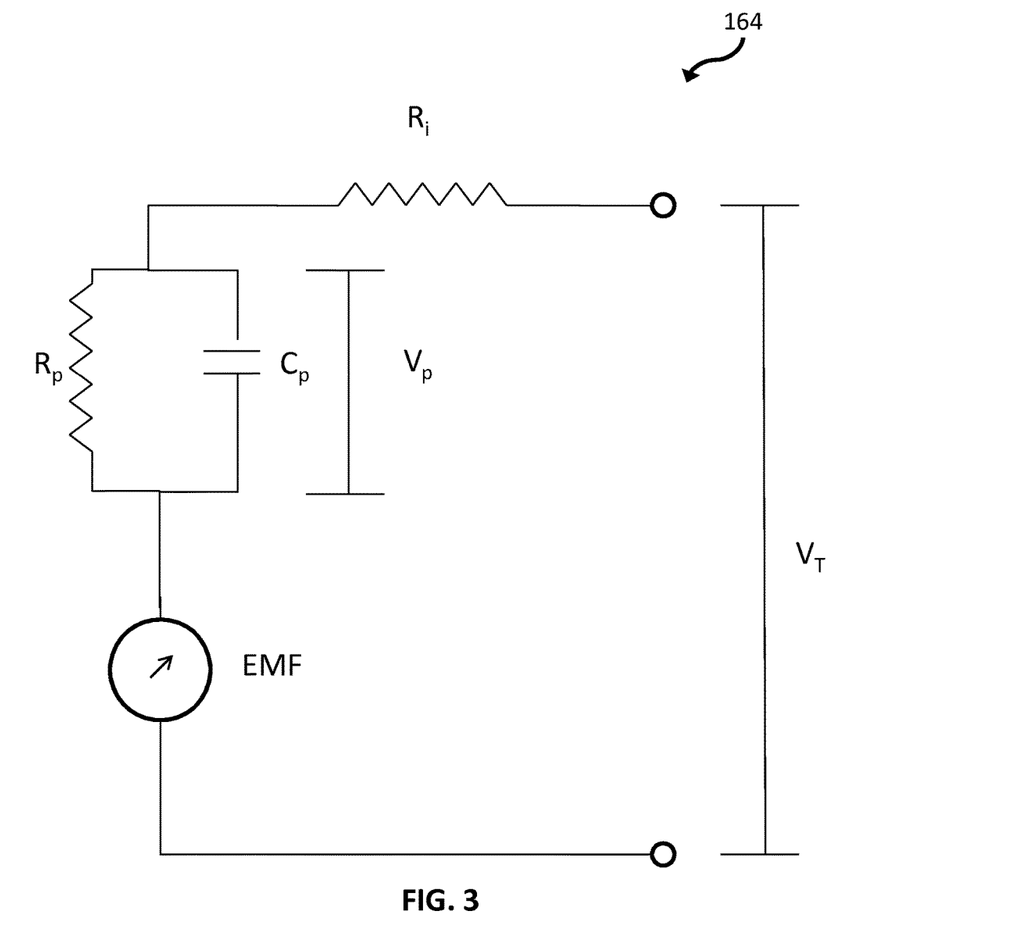
FIG. 3 illustrates an exemplary model of the battery system of FIG. 1.

In one embodiment, determination of the SOH of battery system 164 is made based on a model of battery system 164. Referring to FIG. 3, an exemplary model of battery system 164 is shown. Based on the model, the following equation represents the battery system 164.

$$V_T = EMF + V_P + I(R_I) + h \quad (1)$$

wherein $V_T$ is the measured terminal voltage of battery system 164, I is the measured current of battery system 164, EMF is the electromotive force of battery system 164, $V_P$ is the voltage drop attributable to polarization characteristics of battery system 164, h is the voltage drop attributable to hysteresis characteristics of battery system 164, and $R_I$ is the internal resistance of battery system 164. In one embodiment, $V_T$ is measured with device 112 and I is measured with device 110. Values for EMF, $V_P$, and h are dependent on the SOC of battery system 164 and the temperature (T) of the battery system 164 which is measured with a temperature sensor. In one embodiment, a table of values for each of EMF, $V_P$, and h are provided based on values of SOC and T. In one embodiment, the SOC of battery system 164 is determined based on $V_T$, I, and T in accordance with the teaching of U.S. patent application Ser. No. 13/576,785, titled MONITORING BATTERY STATE OF CHARGE, the disclosure of which is expressly incorporated by reference.

As such, based on the measured values of $V_T$, I, and T, the value for $R_I$ may be determined. Equation (1) may be rewritten as follows:

$$R_I = \frac{V_T - (EMF + V_P + h)}{I} \quad (2)$$

Figure 4:
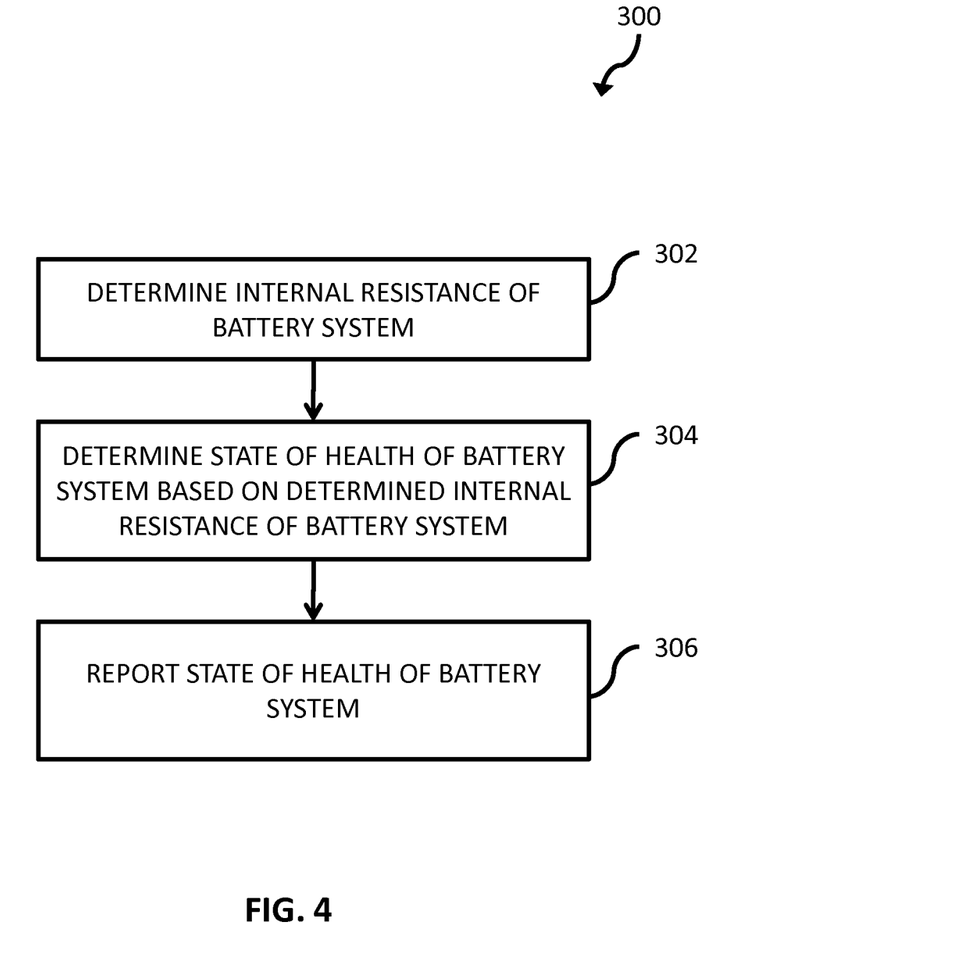
FIG. 4 illustrates an exemplary processing sequence of the SOH monitor of FIG. 1.

Referring to FIG. 4, in an exemplary processing sequence 300, controller 108 determines a value for the internal resistance ($R_I$) of battery system 164, as represented by block 302. In one embodiment, internal resistance ($R_I$) of battery system 164 is determined based on equation (2). Further, a SOH of battery system 164 is determined based on the determined internal resistance ($R_I$) of battery system 164, as represented by block 304. An exemplary processing sequence for determining a SOH of battery system 164 is provided in FIGS. 5A and 5B discussed in more detail herein. The SOH of the battery system or an indication thereof is reported by controller 108 to component 122, as represented by block 306. In one embodiment, controller 108 reports the SOH of battery system 164 to user interface 190. In one embodiment, controller 108 determines if the determined SOH falls within one or more categories and provides an indication of that category. For example, in one embodiment, controller 108 reports a low SOH when the determined SOH is below a threshold value.

Figure 5A:
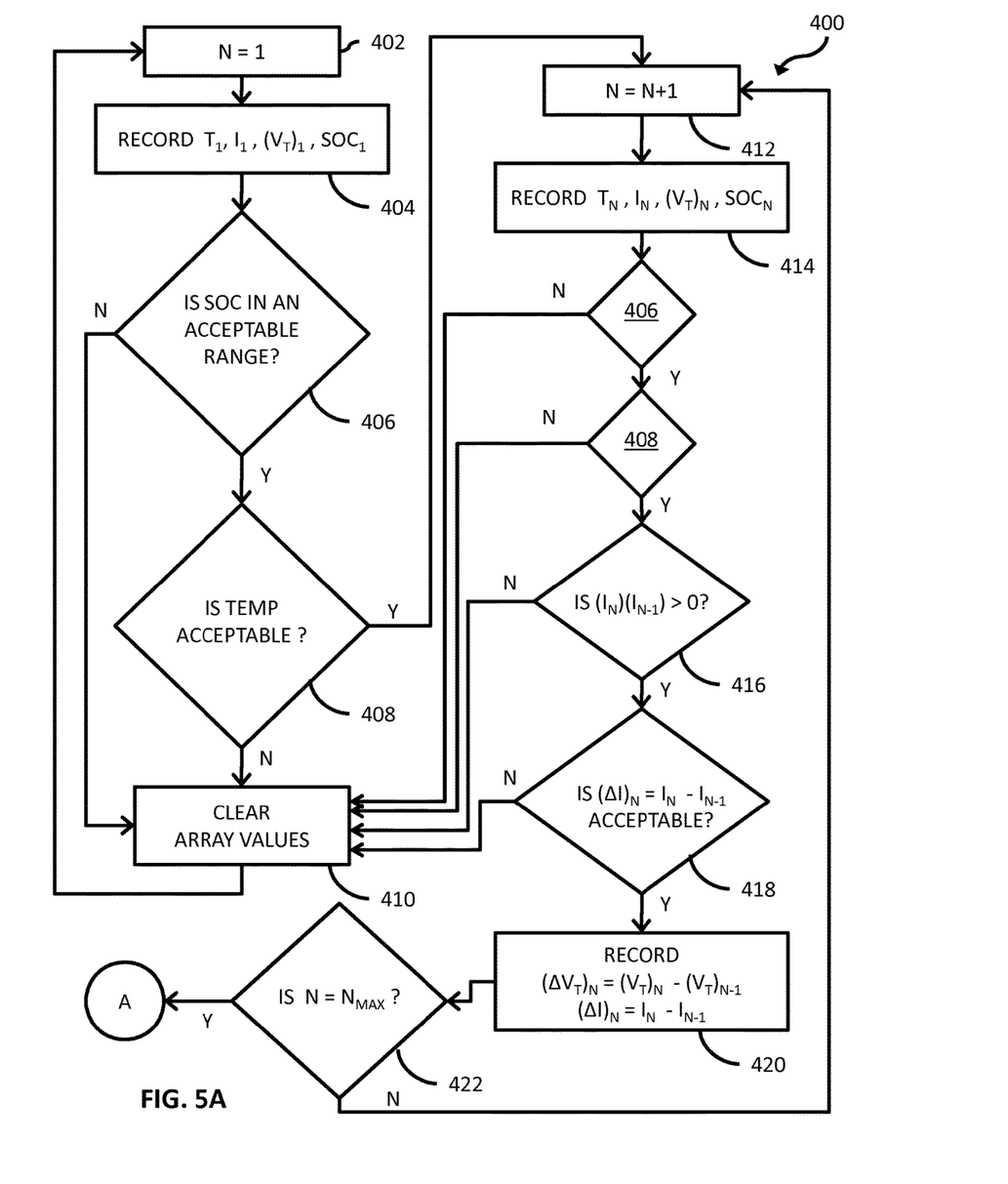
FIGS. 5A and 5B illustrate an exemplary processing sequence of the SOH monitor of FIG. 1.
Figure 5B:
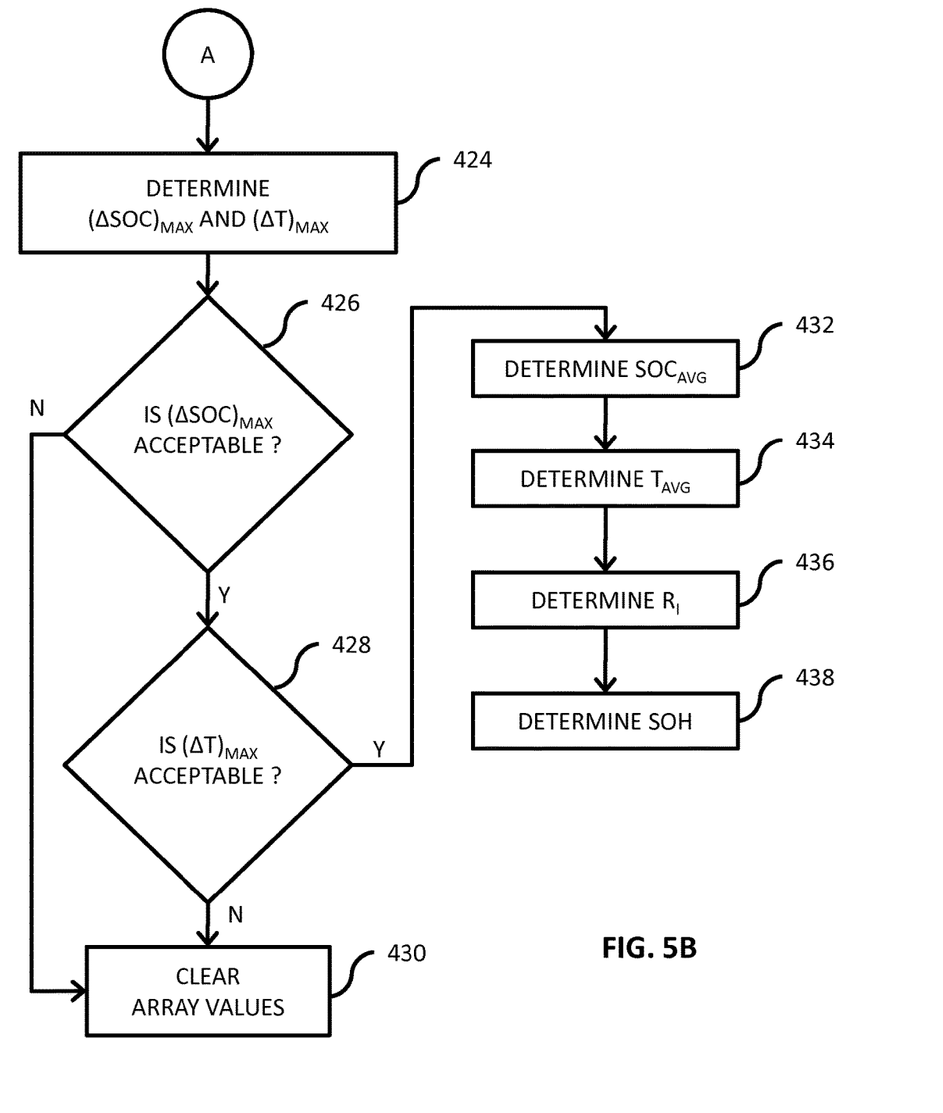

Referring to FIGS. 5A and 5B, a processing sequence 400 is shown for determining the SOH of battery system 164. A counter N is set equal to 1, as represented by block 402. Values for $(T_1),(I_1),((V_T)_1)$, and $(SOC_1)$ are recorded, as represented by block 404. As mentioned herein, $(T_1),(I_1),((V_T)_1)$ are measured values and $(SOC_1)$ is determined by controller 108. The recorded value of $(SOC_1)$ is compared to one or more threshold values to determine if the value of $(SOC_1)$ is an acceptable, as represented by block 406. In one embodiment, the value of $(SOC_1)$ is compared to a lower threshold value and to an upper threshold value. In one embodiment, $(SOC_1)$ is a normalized value from 0 to 1 and the recorded $(SOC_1)$ value is considered acceptable if the recorded $(SOC_1)$ is greater than about 0.2 and is less than about 0.9. Further, the measured value of $(T_1)$ is compared to one or more threshold values to determine if the value of $(T_1)$ is acceptable, as represented by block 408. In one embodiment, the value of $(T_1)$ is compared to a lower threshold value. In one embodiment, the lower threshold value is about 0° C. If either the value of $(SOC_1)$ or $(T_1)$ is not acceptable, the recorded values for $(T_1),(I_1),((V_T)_1)$, and $(SOC_1)$ are cleared from memory element 114, as represented by block 410.

If both values of $(SOC_1)$ or $(T_1)$ are acceptable, the value of the counter is incremented, as represented by block 412. In one embodiment, controller 108 increments the counter and takes readings at spaced apart intervals. An exemplary interval spacing is about 0.2 seconds. Another exemplary interval spacing is about a few seconds. The next set of values for $(T_N),(I_N),((V_T)_N)$, and $(SOC_N)$ are recorded, as represented by block 414. The recorded values for $(SOC_N)$ and $(T_N)$ are again reviewed to determine if they are acceptable, as represented by blocks 406 and 408, respectively.

In addition, controller 108 determines if the current (I) has changed sign, as represented by block 416. In the illustrated embodiment, controller 108 determines if (I) has changed sign by determining if the product of $(I_{N-1})$ and $(I_N)$ is greater than zero. If the product is greater than zero then the sign of the current has not changed. Next, controller 108 determines if the change in measured current is acceptable, as represented by block 418. In one embodiment, the change in current is compared to a threshold. In one embodiment, if the change in current is at least about 1A then the change in current is considered to be acceptable.

The change in measured $(V_T)$ and (I) are recorded, as represented by block 420. The process is repeated until a present number of samples are recorded, as represented by block 422. Next controller 108 determines if the largest change in SOC ($\Delta SOC_{MAX}$) is acceptable, as represented by block 426. In one embodiment, the change in SOC is compared to a threshold. In one embodiment, if the change in SOC is less than about 0.005 then the change in SOC is considered to be acceptable. In a similar fashion, controller 108 determines if the largest change in temperature ($\Delta T_{MAX}$) is acceptable, as represented by block 428. In one embodiment, the change in temperature is compared to a threshold. In one embodiment, if the change in temperature is less than about 1 degree then the change in temperature is considered to be acceptable. If either the value of ($\Delta SOC_{MAX}$) or ($\Delta T_{MAX}$) is not acceptable, the recorded values are cleared from memory element 114, as represented by block 430.

Controller 108 determines an average SOC, as represented by block 432 and stores this value in memory element 114. In one embodiment, the average SOC is determined by dividing a sum of the determined SOC values by the number of samples. Further, an average temperature is determined, as represented by block 434 and stored in memory element 114. In one embodiment, the average temperature is determined by dividing a sum of the measured temperature values by the number of samples.

Lastly, an average internal resistance $((R_1)_{AV})$ of battery system 164 is determined as represented by block 436. In one embodiment, the value of the average internal resistance $((R_1)_{AV})$ of battery system 164 is determined based on the stored values and equation (3).

$$(R_I)_{AV} = \frac{\sum_{N=2}^{N_{STOP}} |\Delta V_N|}{\sum_{N=2}^{N_{STOP}} |\Delta I_N|} \quad (3)$$

wherein $$\Delta V_N = ((V_T)_N - ((EMF)_N + (V_P)_N + (h)_N)) - ((V_T)_{N-1} - ((EMF)_{N-1} + (V_P)_{N-1} + (h)_{N-1})) \text{ and}$$

$$\Delta I_N = (I_N - I_{N-1})$$

In one embodiment, the average internal resistance is determined through a least squares determination or other suitable numerical methods In one embodiment, database tables are provided in memory element 114 for each of (EMF), $(V_P)$, and (h) as a function of SOC. In one embodiment, database tables are provided in memory element 114 for each of (EMF), $(V_P)$, and (h) as a function of SOC and temperature.

Controller 108 determines the SOH of battery system 164, as represented by block 438. In one embodiment, controller 108 queries a SOC_temperature_Age_Resistance table 182 stored in memory element 114 and retrieves the SOH value corresponding to the provided values of average SOC, the average T, and the average internal resistance. In one embodiment, the values in the table 182 need to be interpolated to provide the SOH value.

While the present disclosure primarily involves a battery system for a vehicle, it should be understood, that the invention may have application to other systems which receive power from battery systems, such as a stationary energy storage system. Exemplary applications for a stationary storage system include providing power to a power grid, providing power as an uninterrupted power supply, and other loads that may utilize a stationary energy storage system. In one embodiment, the systems and methods disclosed herein may be implemented to provide an uninterrupted power supply for computing devices and other equipment in data centers.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. A method for monitoring a battery connected to a load, the method comprising:
measuring a voltage of the battery, a temperature of the battery, and a current of the battery;
determining, by at least one electronic controller, a state-of-charge (SOC) of the battery, an electromotive force of the battery, a first voltage drop of the battery due to polarization of the battery, and a second voltage drop of the battery due to hysteresis of the battery;
determining, by the at least one electronic controller, internal resistance of the battery based on the measured voltage, the measured temperature, the measured current, the determined state-of-charge (SOC), the determined electromotive force, the determined first voltage drop, and the determined second voltage drop; and
determining, by the at least one electronic controller, a state-of-health (SOH) of the battery based on the determined internal resistance of the battery.

2. The method of claim 1, wherein the at least one electronic controller determines the electromotive force of the battery, the first voltage drop of the battery, and the second voltage drop of the battery based on the determined state-of-charge (SOC).

3. The method of claim 1, wherein the at least one electronic controller determines the electromotive force of the battery, the first voltage drop of the battery, and the second voltage drop of the battery based on the determined state-of-charge (SOC) and the measured temperature of the battery.

4. The method of claim 3, wherein the at least one electronic controller determines the internal resistance of the battery by subtracting the electromotive force of the battery, the first voltage drop of the battery, and the second voltage drop of the battery from the measured voltage of the battery and dividing by the measured current.

5. A method for monitoring a battery connected to a load, the method comprising:
measuring, by at least one electronic controller, a set of values of the battery at a plurality of spaced apart intervals, the set of values including a measured voltage of the battery, a measured temperature of the battery, and a measured current of the battery;
determining, by the at least one electronic controller for each set of values, a state-of-charge (SOC) of the battery, an electromotive force of the battery, a first voltage drop of the battery due to polarization of the battery, and a second voltage drop of the battery due to hysteresis of the battery;
determining, by the at least one electronic controller, an internal resistance of the battery, wherein the step of determining the internal resistance of the battery includes the step of determining an average internal resistance of the battery; and
determining, by the at least one electronic controller, a state-of-health (SOH) of the battery based on the determined internal resistance of the battery.

6. The method of claim 5, wherein the at least one electronic controller determines the average internal resistance of the battery by the following relationship:

$$(R_I)_{AV} = \frac{\sum_{N=2}^{N_{STOP}} |\Delta V_N|}{\sum_{N=2}^{N_{STOP}} |\Delta I_N|}$$

wherein $\Delta V_N = ((V_T)_N - ((EMF)_N + (V_P)_N + (h)_N)) - ((V_T)_{N-1} - ((EMF)_{N-1} + (V_P)_{N-1} + (h)_{N-1}))$ and $\Delta I_N = (I_N - I_{N-1})$, wherein $(R_1)Av$ is the determined average internal resistance, I is the measured current of the battery, $V_T$ is the measured voltage of the battery, EMF is the determined electromotive force of the battery, $V_P$ is the determined first voltage drop of the battery due to polarization of the battery, h is the determined second voltage drop of the battery due to hysteresis of the battery, and N is an interval identifier of the set of values.

7. The method of claim 6, further comprising the steps of:
   determining, by the at least one electronic controller, an average state-of-charge (SOC) of the battery; and
   determining, by the at least one electronic controller, an average temperature of the battery,
   wherein the at least one electronic controller determines the state-of-health (SOH) of the battery based further on the determined average state-of-charge (SOC) of the battery and on the determined average temperature of the battery.

8. The method of claim 5, wherein the at least one electronic controller clears the set of values from a memory if a condition of the battery is not satisfied.

9. The method of claim 8, wherein the condition of the battery is one of:
   the determined state-of-charge (SOC) is not within a first range of state-of-charge (SOC) values;
   the measured temperature is not within a second range of temperature values;
   a product of the measured current from a current interval and a preceding interval is less than zero;
   a difference between the measured current from a current interval and the measured current from a preceding interval is greater than a first threshold;
   a maximum change in the determined state-of-charge (SOC) is greater than a second threshold; and
   a maximum change in the measured temperature is greater than a third threshold.

10. The method of claim 5, wherein the at least one electronic controller determines the average internal resistance of the battery based on the sets of values and on the determined state-of-charge (SOC), electromotive force, first voltage drop, and second voltage drop for the sets of values.

11. The method of claim 10, wherein the at least one electronic controller determines the state-of-health (SOH) of the battery based on the determined average internal resistance of the battery.

12. The method of claim 5, wherein the at least one electronic controller determines the state-of-health (SOH) of the battery based on the determined average internal resistance of the battery.

13. The method of claim 12, further comprising the steps of:
   determining, by the at least one electronic controller, an average state-of-charge (SOC) of the battery; and
   determining, by the at least one electronic controller, an average temperature of the battery,
   wherein the at least one electronic controller determines the state-of-health (SOH) of the battery based further on the determined average state-of-charge (SOC) of the battery and on the determined average temperature of the battery.

14. The method of claim 6, wherein the at least one electronic controller determines the state-of-health (SOH) of the battery based on the determined average internal resistance of the battery.

15. The method of claim 14, further comprising the steps of:
   determining, by the at least one electronic controller, an average state-of-charge (SOC) of the battery; and
   determining, by the at least one electronic controller, an average temperature of the battery,
   wherein the at least one electronic controller determines the state-of-health (SOH) of the battery based further on the determined average state-of-charge (SOC) of the battery and on the determined average temperature of the battery.

16. A method for monitoring a battery connected to a load, the method comprising:
   determining, by at least one electronic controller, a state-of-charge (SOC) of the battery, an electromotive force of the battery, a first voltage drop of the battery due to polarization of the battery, and a second voltage drop of the battery due to hysteresis of the battery;
   determining, by the at least one electronic controller, an internal resistance of the battery based on the determined state-of-charge (SOC), the determined electromotive force, the determined first voltage drop, and the determined second voltage drop; and
   determining, by the at least one electronic controller, a state-of-health (SOH) of the battery based on the determined internal resistance of the battery.

17. The method of claim 16, wherein the at least one electronic controller determines the electromotive force of the battery, the first voltage drop of the battery, and the second voltage drop of the battery based on the determined state-of-charge (SOC).

18. The method of claim 16, further comprising the step of:
   measuring a temperature of the battery,
   wherein the at least one electronic controller determines the electromotive force of the battery, the first voltage drop of the battery, and the second voltage drop of the battery based on the determined state-of-charge (SOC) and the measured temperature of the battery.

19. The method of claim 18, further comprising the step of:
   measuring a voltage of the battery,
   wherein the at least one electronic controller determines the internal resistance of the battery by subtracting the electromotive force of the battery, the first voltage drop of the battery, and the second voltage drop of the battery from the measured voltage of the battery and dividing by the measured current.

* * * * *